United States Patent [19]

Kusano

[11] Patent Number: 5,241,550
[45] Date of Patent: Aug. 31, 1993

[54] SYSTEM FOR ACCURATELY CONFIRMING CROSS-CONNECTION IN A CROSS-CONNECTION NETWORK

[75] Inventor: Toshihiko Kusano, Tokyo, Japan
[73] Assignee: NEC Corporation, Tokyo, Japan
[21] Appl. No.: 683,435
[22] Filed: Apr. 11, 1991
[30] Foreign Application Priority Data Apr. 11, 1990 [JP] Japan ................................ 2-93945

[51] Int. Cl.⁵ .......................................... G01R 31/28
[52] U.S. Cl. .................................... 371/71; 370/112; 371/24; 371/25.1
[58] Field of Search ......................... 371/24, 25.1, 71; 370/58.1, 112; 395/575

[56] References Cited

U.S. PATENT DOCUMENTS

| | | | |
|---|---|---|---|
| 3,008,129 | 11/1961 | Katz | 371/71 |
| 3,049,692 | 8/1962 | Hunt | 371/71 |
| 4,935,921 | 6/1990 | Ishizaki et al. | 370/58.1 |
| 5,189,410 | 2/1993 | Kosugi et al. | 340/825.14 |

Primary Examiner—Charles E. Atkinson
Attorney, Agent, or Firm—Foley & Lardner

[57] ABSTRACT

On confirming whether or not a matrix switch correctly carries out cross-connection between input and output terminals of the switch in accordance with connection information signals memorized in a memory included in a controller, a cross-connection confirming system makes use of input digital signals which are sent from input lines to output lines through the matrix switch. Connected between the input lines and the input terminals, processing circuits make the input digital signals comprise input terminal codes assigned to the input terminals to which the processing circuits are connected, respectively. Judging circuits are connected to the output terminals to judge whether or not the input terminal codes included in output digital signals are coincident with output signals sent from the memory, respectively.

4 Claims, 5 Drawing Sheets

SYSTEM FOR ACCURATELY CONFIRMING CROSS-CONNECTION IN A CROSS-CONNECTION NETWORK

BACKGROUND OF THE INVENTION

This invention relates to a cross-connection confirming system for use in a cross-connection network.

The cross-connection network comprises first through N-th input lines, first through N-th output lines, a matrix switch, and a controller, where N represents an integer greater than one. The matrix switch is typically a space matrix switch and comprises first through N-th input terminals having input terminal codes, respectively, and first through N-th output terminals having output terminal codes, respectively.

The controller comprises a memory for memorizing connection information signals indicating, in correspondence to the input terminal codes of the first through the N-th input terminals, the output terminal codes of connecting destination ones of the first through the N-th output terminals. The connecting destination ones of the first through the N-th output terminals should be connected to the first through the N-th input terminals, respectively.

The controller further comprises a control unit connected to the memory and the matrix switch. The control unit controls the matrix switch to make the matrix switch cross connect between the first through the N-th input terminals and the connecting destination ones of the first through the N-th output terminals in accordance with the connection information signals.

The cross-connection confirming system is for confirming whether or not the matrix switch correctly carries out cross-connection between the first through the N-th input and the first through the N-th output terminals in accordance with the connection information signals.

In a conventional cross-connection system, the first through the N-th input lines are directly connected to the first through the N-th input terminals, respectively. The first through the N-th output terminals are directly connected to the first through the N-th output lines, respectively. As will later be described, attention is never directed to making use of signals which are sent from the input lines to the output lines through the matrix switch in order to confirm the cross-connection in the conventional cross-connection confirming system. As will also be described later, the conventional cross-connection confirming system is defective in that it is impossible to accurately confirm whether or not the matrix switch correctly carries out the cross-connection between the input and the output terminals in accordance with the connection information signals.

SUMMARY OF THE INVENTION

It is therefore an object of this invention to provide a cross-connection confirming system which is capable of accurately confirming whether or not a matrix switch correctly carries out cross-connection between input and output terminals of the matrix switch in accordance with the connection information signals.

It is another object of this invention to provide a cross-connection confirming system of the type described, which makes use of signals sent from input lines to output lines through the matrix switch.

Other objects of this invention will become clear as the description proceeds.

On describing the gist of this invention, it is possible to understand that a cross-connection confirming system is for use in a cross-connection network comprising first through N-th input lines, a matrix switch, and a controller, where N represents an integer greater than one. The matrix switch comprises first through N-th input terminals having input terminal codes, respectively, and first through N-th output terminals having output terminal codes, respectively. The controller comprises: a memory for memorizing connection information signals indicating, in correspondence to the input terminal codes of the first through the N-th input terminals, the output terminal codes of connecting destination ones of the first through the N-th output terminals that should be connected to the first through the N-th input terminals, respectively; and a control unit connected to the memory and the matrix switch for controlling the matrix switch to make the matrix switch cross connect between the first through the N-th input terminals and the connecting destination ones of the first through the N-th output terminals in accordance with the connection information signals. The cross-connection confirming system being for confirming whether or not the matrix switch correctly carries out cross-connection between the first through the N-th input and the first through the N-th output terminals in accordance with the connection information signals.

According to an aspect of this invention, the above-understood cross-connection confirming system comprises: first through N-th input terminal code generating means for generating input terminal code signals representative of the input terminal codes of the first through the N-th input terminals, respectively; first through N-th processing means connected to the first through the N-th input terminal code generating means, to the first through the N-th input terminals, and to the first through the N-th input lines, respectively, and supplied with first through N-th input digital signals through the first through the N-th input lines, respectively, each of the first through the N-th input digital signals including transmission data bit fields and blank bit fields having blank bits representative of zero values and periodically appearing in each of the first through the N-th input digital signals, the first through the N-th processing means being for processing the first through the N-th input digital signals into first through N-th processed signals given by inserting the input terminal code signals representative of the input terminal codes of the first through the N-th input terminals into the blank bit fields of the first through the N-th input digital signals, respectively, the first through the N-th processing means being for delivering the first through the N-th processed signals to the first through the N-th input terminals, respectively; and first through N-th judging means connected to the memory in common, to the first through the N-th output terminals, respectively, and to the control unit in common. The first through the N-th judging means are for receiving first through N-th output digital signals from the first through the N-th output terminals, respectively, and for receiving corresponding ones of the input terminal codes of the first through the N-th input terminals from the memory, respectively. The corresponding ones of the input terminal codes of the first through the N-th input terminals correspond to the output terminal codes of the first through the N-th output terminals to which the first through the N-th judging means are connected. The first through the N-th judging means are for carrying out judgment as regards whether or not the input terminal codes represented by the input terminal code signals included in the first through the N-th output digital signals coincide with the corresponding ones of the input terminals codes of the first through the N-th input terminals, respectively. The first through the N-th judging means thereby produce judgment result signals representative of results of the judgment, respectively, and delivering the judgment result signals to the control unit. The control unit is for receiving the judgment result signals and for confirming, when all of the results of the judgment are affirmative and when at least one of the results of the judgment is negative, that the matrix switch correctly carries out the cross-connection and that the matrix switch does not correctly carry out the cross-connection, respectively.

According to another aspect of this invention, the above-understood cross-connection confirming system comprises: first through N-th processing means connected to the memory in common, to the first through the N-th input terminals, and to the first through the N-th input lines, respectively, and supplied with first through N-th input digital signals through the first through the N-th input lines, respectively, each of the first through the N-th input digital signals including transmission data bit fields and blank bit fields having blank bits representative of zero values and periodically appearing in each of the first through the N-th input digital signals, the first through the N-th processing means being for receiving correspondence terminal code signals representative of corresponding ones of the output terminal codes of the first through the N-th output terminals from the memory, respectively, the corresponding ones of the output terminal codes of the first through the N-th output terminals corresponding to the input terminal codes of the first through the N-th input terminals to which the first through the N-th processing means are connected, the first through the N-th processing means being for processing the first through the N-th input digital signals into first through N-th processed signals given by inserting the correspondence terminal code signals representative of the corresponding ones of the output terminal codes of the first through the N-th output terminals into the blank bit fields of the first through the N-th input digital signals, respectively, the first through the N-th processing means being for delivering the first through the N-th processed signals to the first through the N-th input terminals, respectively; first through N-th output terminal code generating means for generating output terminal code signals representative of the output terminal codes of the first through the N-th output terminals, respectively; and first through N-th judging means connected to the first through the N-th output terminal code generating means, to the first through the N-th output terminals, respectively, and to the control unit in common. The first through the N-th judging means are for receiving first through N-th output digital signals from the first through the N-th output terminals, respectively. The first through the N-th judging means are for carrying out judgment as regards whether or not the corresponding ones of the output terminal codes represented by the correspondence terminal code signals included in the first through the N-th output digital signals coincide with the output terminal codes represented by the output terminal code signals, respectively. The first through the N-th judging means thereby produce judgment result signals representative of results of the judgment, respectively, and delivering the judgment result signals to the control unit. The control unit is for receiving the judgment result signals and for confirming, when all of the results of the judgment are affirmative and when at least one of the results of the judgment is negative, that the matrix switch correctly carries out the cross-connection and that the matrix switch does not correctly carry out the cross-connection, respectively.

DESCRIPTION OF THE PREFERRED EMBODIMENTS

Figure 1:
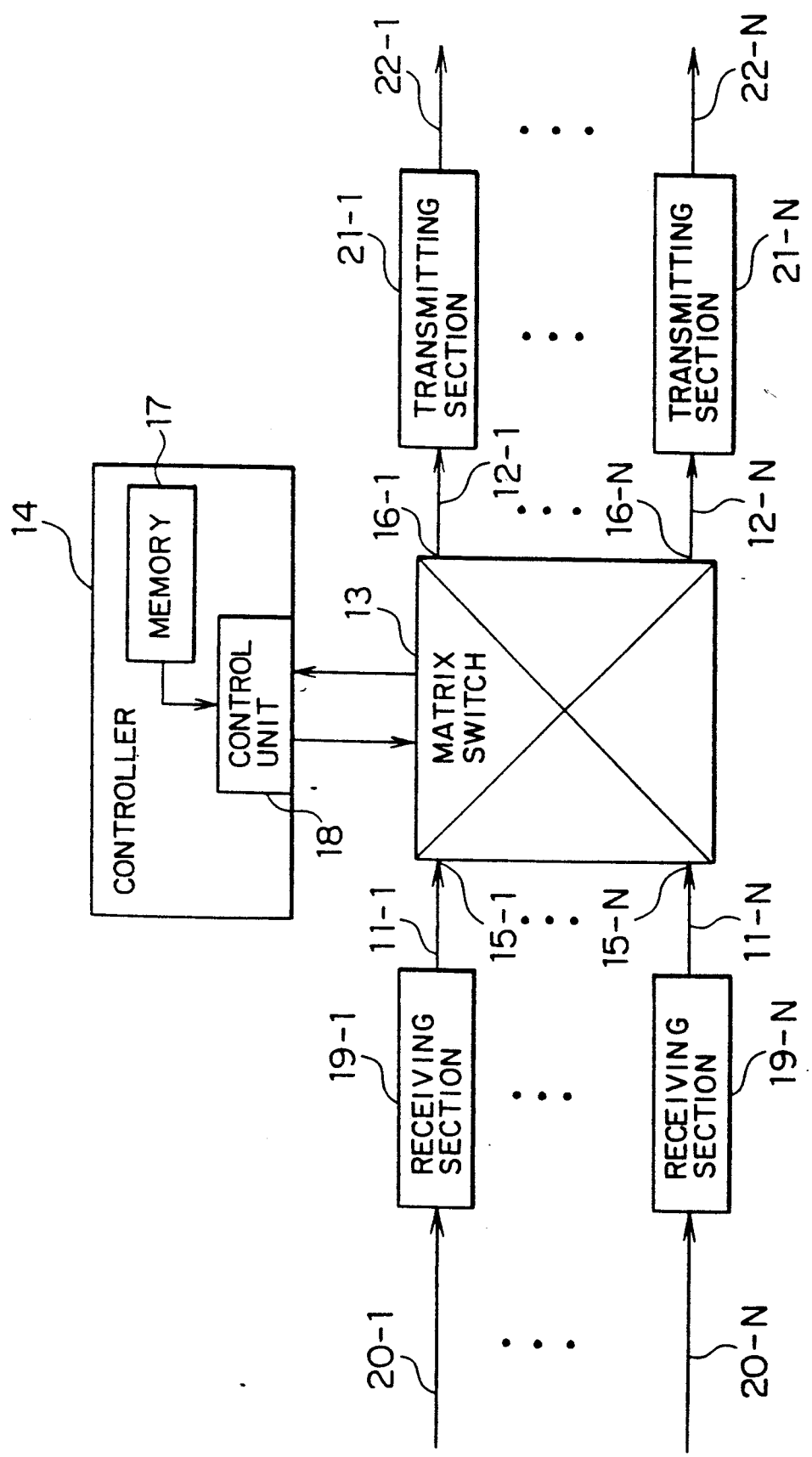
FIG. 1 is a block diagram of a conventional cross-connection confirming system.

Referring to FIG. 1, a conventional cross-connection confirming system will be described at first for a better understanding of this invention. The conventional cross-connection confirming system is equivalent to a conventional cross-connection confirming system which is described in the preamble of the instant specification.

As described in the preamble of the instant specification, the conventional cross-connection confirming system is for use in a cross-connection network comprising first through N-th input lines 11-1 to 11-N, first through N-th output lines 12-1 to 12-N, a matrix switch 13, and a controller 14, where N represents an integer greater than one. The matrix switch 13 comprises first through N-th input terminals 15-1 to 15-N having input terminal codes, respectively, and first through N-th output terminals 16-1 to 16-N having output terminal codes, respectively.

Figure 2:
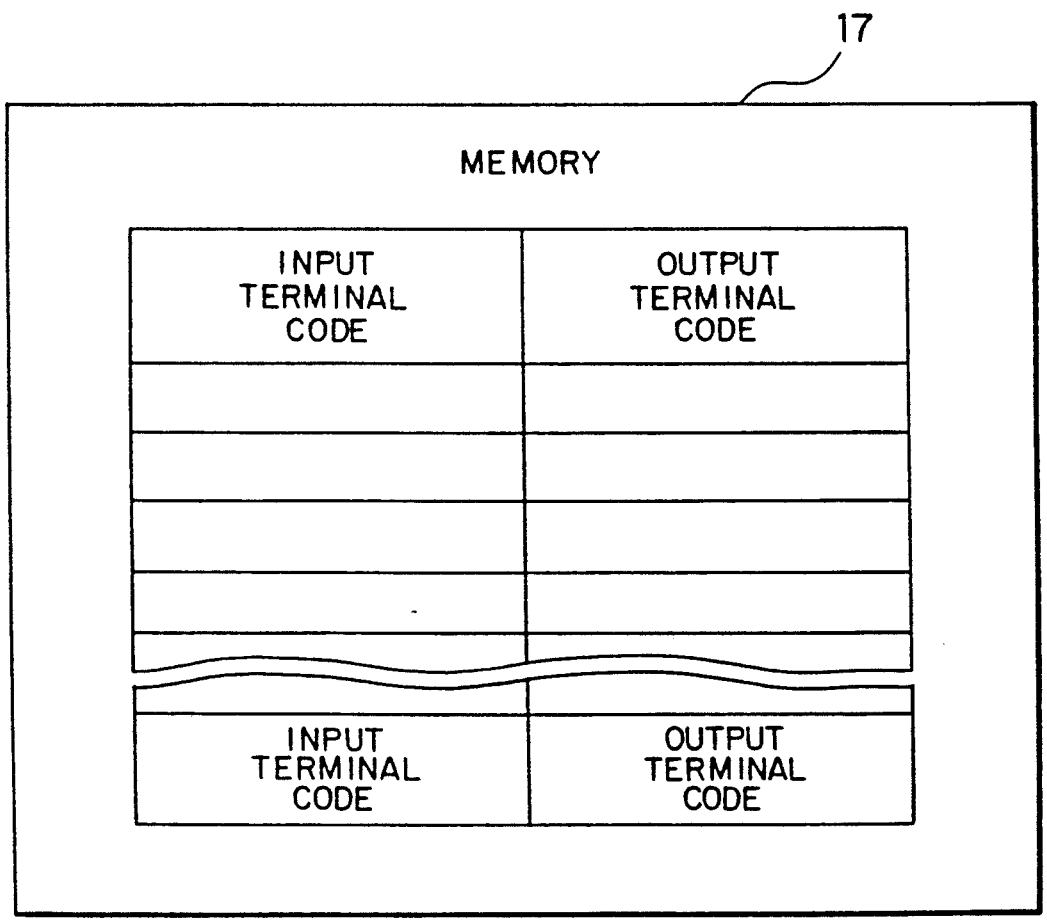
FIG. 2 is a diagram for use in describing operation of a memory which is used in the cross-connection confirming system illustrated in FIG. 1 and which is also used in a cross-connection confirming system according to this invention.

The controller 14 comprises a memory 17 which memorizes connection information signals indicating, in correspondence to the input terminal codes of the first through the N-th input terminals 15-1 to 15-N, the output terminal codes of connecting destination ones of the first through the N-th output terminals 16-1 to 16-N, respectively. The connecting destination ones of the first through the N-th output terminals 16-1 to 16-N should be connected to the first through the N-th input terminals 15-1 to 15-N, respectively. The input terminal codes of the first through the N-th input terminals 15-1 to 15-N and the output terminal codes of the first through the N-th output terminals 16-1 to 16-N are shown in FIG. 2.

In FIG. 1, a control unit 18 is connected to the memory 17 and the matrix switch 13. The control unit 18 controls the matrix switch 13 to make the matrix switch 13 cross connect between the first through the N-th input terminals 15-1 to 15-N and the connecting destination ones of the first through the N-th output terminals 16-1 to 16-N in accordance with the connection information signals.

The conventional cross-connection confirming system is for confirming whether or not the matrix switch 13 correctly carries out cross-connection between the first through the N-th input terminals 15-1 to 15-N and the first through the N-th output terminals 16-1 to 16-N in accordance with the connection information signals. In the conventional cross-connection confirming system, the first through the N-th input lines 11-1 to 11-N are directly connected to the first through the N-th input terminals 15-1 to 15-N, respectively. The first through the N-th output terminals 16-1 to 16-N are directly connected to the first through the N-th output lines 12-1 to 12-N, respectively.

First through N-th receiving sections 19-1 to 19-N are connected to first through N-th input transmission paths 20-1 to 20-N, respectively, and also connected to the first through the N-th input lines 11-1 to 11-N, respectively. When each of the input transmission paths 11-1 to 11-N is an optical fiber, the first through the N-th receiving sections 19-1 to 19-N receive first through N-th input light information signals from the first through the N-th input transmission paths 20-1 to 20-N and convert the first through the N-th input light information signals into first through N-th electric information signals, respectively, which will be referred to as first through N-th input digital signals, respectively. The first through the N-th input digital signals are delivered to the first through the N-th input terminals 15-1 to 15-N through the first through the N-th input lines 11-1 to 11-N.

First through N-th transmitting sections 21-1 to 21-N are connected to the first through the N-th output lines 12-1 to 12-N, respectively, and also connected to the first through the N-th output transmission paths 22-1 to 22-N, respectively. When each of the output transmission paths 22-1 to 22-N is another optical fiber, the first through the N-th transmitting sections 21-1 to 21-N receive first through N-th output digital signals from the first through the N-th output lines 12-1 to 12-N and convert the first through the N-th output digital signals into first through N-th output light information signals which are delivered to the first through the N-th output transmission paths 22-1 to 22-N, respectively.

On confirming whether or not the matrix switch 13 correctly carries out the cross-connection in accordance with the connection information signals in the conventional cross-connection confirming system, the control unit 18 reads the input terminal codes and the connection information signals out of the memory 17 and stores the input terminal codes and the connection information signals into an inside memory (not shown) of the matrix switch 13. In accordance with a content of the inside memory, the matrix switch 13 cross connects between the input terminals 15 (suffixes omitted) and the output terminals 16 (suffixes omitted). After the matrix switch 13 carries out the cross-connection, the control unit 18 reads the input terminal codes and the connection information signals out of the inside memory as state information of the matrix switch 13. Thereafter, the control unit 18 judges whether or not the state information coincide with a combination of the input terminal codes and the connection information signals that is memorized in the memory 17.

In this event, when the state information coincides with the combination, the control unit 18 confirms that the matrix switch 13 correctly carries out the cross-connection between the input and the output terminals 15 and 16. When the state information does not coincide with the combination, the control unit 18 confirms that the matrix switch 13 does not correctly carry out the cross-connection between the input and the output terminals 15 and 16.

Inasmuch as the conventional cross-connection confirming system does not use signals sent from the input lines 11 (suffixes omitted) to the output lines 12 (suffixes omitted) through the matrix switch 13 in order to confirm the cross-connection, it is impossible to accurately confirm whether or not the matrix switch 13 correctly carries out the cross-connection between the input and the output terminals as described in the preamble of the instant specification.

Figure 3:
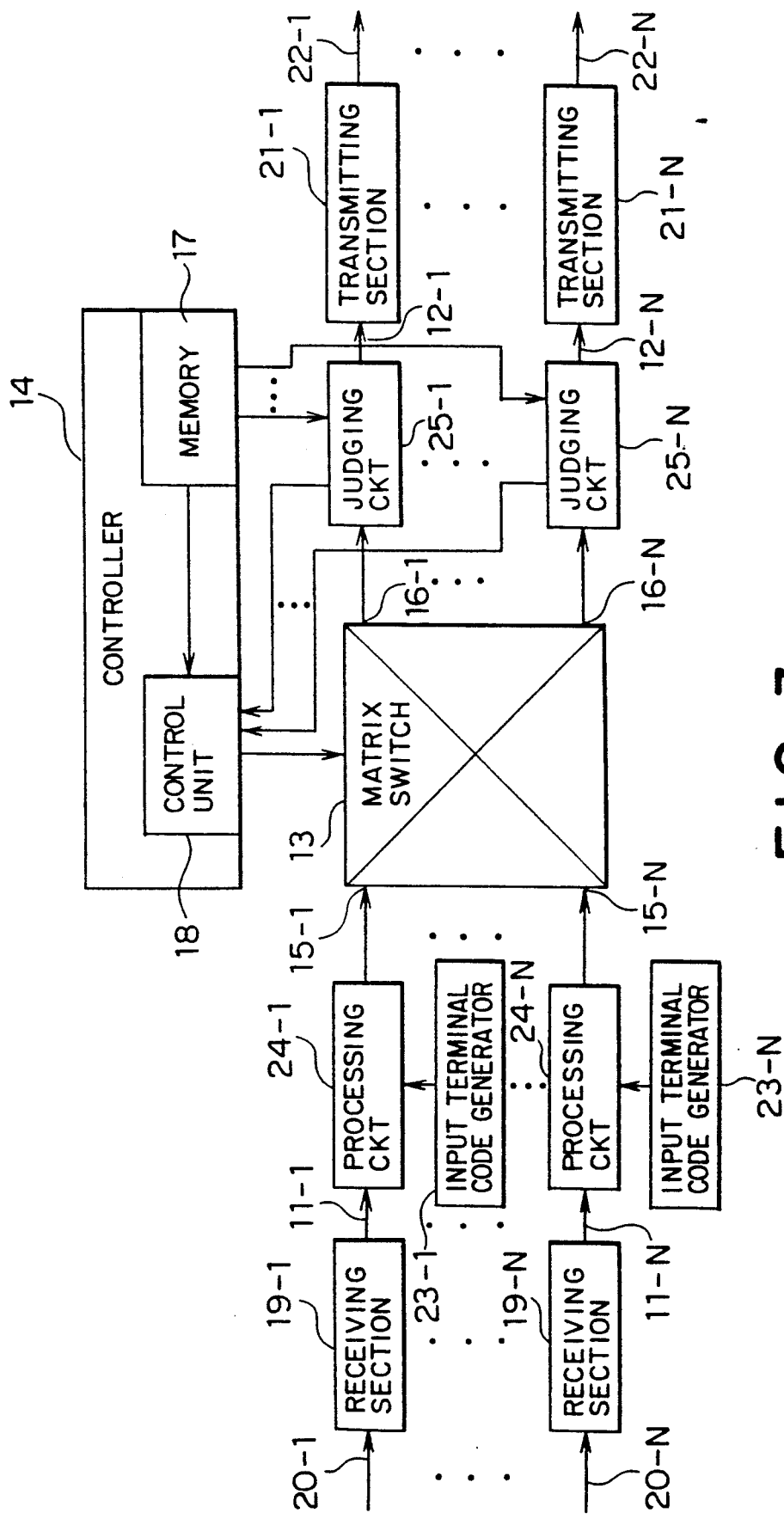
FIG. 3 is a block diagram of a cross-connection confirming system according to a first embodiment of this invention.

Turning to FIG. 3, a cross-connection confirming system according to a first embodiment of this invention comprises similar parts designated by like reference numerals. The cross-connection confirming system comprises first through N-th input terminal code generators 23-1 to 23-N which generate input terminal code signals representative of the input terminal codes of the first through the N-th input terminals 15-1 to 15-N, respectively.

First through N-th processing circuits 24-1 to 24-N are connected to the first through the N-th input terminal code generators 23-1 to 23-N, to the first through the N-th input terminals 15-1 to 15-N, to the first through the N-th input lines 11-1 to 11-N, respectively, and supplied with first through N-th input digital signals through the first through the N-th input lines 11-1 to 11-N, respectively.

Figure 4:
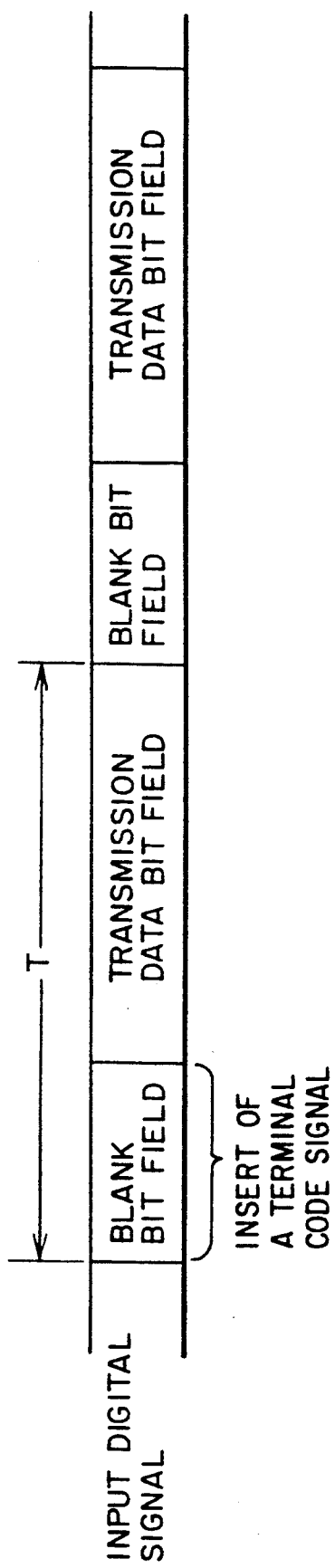
FIG. 4 is a time chart for use in describing operation of the cross-connection confirming system illustrated in FIG. 3.

Turning to FIG. 4, each of the first through the N-th input digital signals includes transmission data bit fields and blank bit fields which have blank bits representative of zero values and periodically appear at a predetermined period T in the input digital signal under consideration. In other words, the blank bit fields have the blank bits, each of which has a logic "0" level. The blank bit fields are produced by the receiving sections 19-1 to 19-N (FIG. 3) in overhead portions of the input digital signal. The overhead portions are known in the art.

Figure 5:
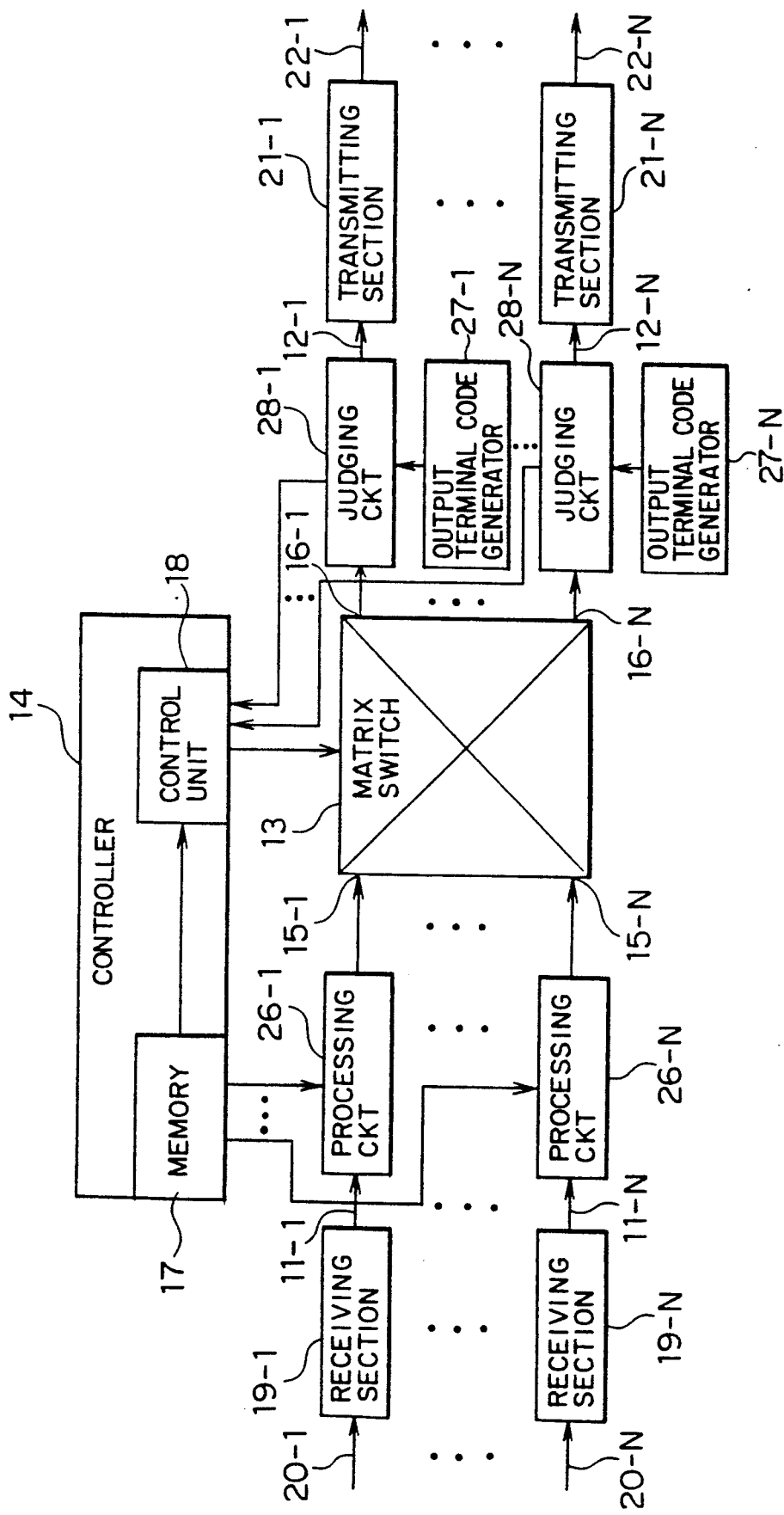
FIG. 5 is a block diagram of a cross-connection confirming system according to a second embodiment of this invention.

Turning back to FIG. 3, the first through the N-th processing circuits 24-1 to 24-N process the first through the N-th input digital signals into first through N-th processed signals which are given by inserting the input terminal code signals representative of the input terminal codes of the first through the N-th input terminals 15-1 to 15-N into the blank bit fields of the first through the N-th input digital signals, respectively (see FIG. 5). The first through the N-th processing circuit 24-1 to 24-N deliver the first through the N-th processed signals to the first through the N-th input terminals 15-1 to 15-N, respectively.

In FIG. 3, first through N-th judging circuits 25-1 to 25-N are connected to the memory 17 in common, to the first through the N-th output terminals 16-1 to 16-N, respectively, and to the control unit 18 in common. The first through the N-th judging circuits 25-1 to 25-N receive first through N-th output digital signals from the first through the N-th output terminals 16-1 to 16-N, respectively. The first through the N-th judging circuits 25-1 to 25-N also receive corresponding ones of the input terminal codes of the first through the N-th input terminals 15-1 to 15-N from the memory 17, respectively. The corresponding ones of the input terminal codes of the first through the N-th input terminals 15-1 to 15-N correspond to the output terminal codes of the first through the N-th output terminals 16-1 to 16-N to which the first through the N-th judging circuits 25-1 to 25-N are connected.

The first through the N-th judging circuits 25-1 to 25-N carry out judgment as regards whether or not the input terminal codes represented by the input terminal code signals included in the first through the N-th output digital signals coincide with the corresponding ones of the input terminal codes of the first through the N-th input terminals, 15-1 to 15-N, respectively. The first through the N-th judging circuits 25-1 to 25-N thereby produce judgment result signals representative of results of the judgment and deliver the judgment result signals to the control unit 18.

The first through the N-th judging circuits 25-1 to 25-N are furthermore connected to the first through the N-th output lines 12-1 to 12-N, respectively. The first through the N-th judging circuits 25-1 to 25-N deliver the first through the N-th output digital signals to the first through the N-th output lines 12-1 to 12-N with the input terminal code signals deleted from the first through the N-th output digital signals, respectively.

The control unit 18 receives the judgment result signals and confirms, when all of the results of the judgment are affirmative and when at least one of the results of the judgment is negative, that the matrix switch 13 correctly carries out the cross-connection and that the matrix switch 13 does not correctly carry out the cross-connection, respectively.

Turning to FIG. 5, a cross-connection confirming system according to a second embodiment of this invention comprises similar parts designated by like reference numerals. The cross-connection confirming system comprises first through N-th processing circuits 26-1 to 26-N connected to the memory 17 in common, to the first through the N-th input terminals 15-1 to 15-N, and to the first through the N-th input lines 11-1 to 11-N, respectively, and supplied with the first through the N-th input digital signals through the first through the N-th input lines 11-1 to 11-N, respectively. The first through the N-th processing circuits 26-1 to 26-N are for receiving correspondence terminal code signals representative of corresponding ones of the output terminal codes of the first through the N-th output terminals 16-1 to 16-N from the memory 17, respectively. The corresponding ones of the output terminal codes of the first through the N-th output terminals 16-1 to 16-N correspond to the input terminal codes of the first through the N-th input terminals 15-1 to 15-N to which the first through the N-th processing circuits 26-1 to 26-N are connected.

The first through the N-th processing circuits 26-1 to 26-N process the first through the N-th input digital signals into first through N-th processed signals given by inserting the correspondence terminal code signals representative of the correspondence ones of the output terminal codes of the first through the N-th output terminals 16-1 to 16-N into the blank bit fields of the first through the N-th input digital signals, respectively. The first through the N-th processing circuits 26-1 to 26-N delivers the first through the N-th processed signals to the first through the N-th input terminals 15-1 to 15-N, respectively.

First through the N-th output terminal code generators 27-1 to 27-N generate output terminal code signals representative of the output terminal codes of the first through the N-th output terminals 16-1 to 16-N, respectively.

First through N-th judging circuits 28-1 to 28-N are connected to the first through the N-th output terminal code generators 27-1 to 27-N, to the first through the N-th output terminals 16-1 to 16-N, respectively, and to the control unit 18 in common. The first through the N-th judging circuits 28-1 to 28-N receive first through the N-th output digital signals from the first through the N-th output terminals 16-1 to 16-N, respectively. The first through the N-th judging circuits 28-1 to 28-N carry out judgment as regards whether or not the corresponding ones of the output terminal codes represented by the correspondence terminal code signals included in the first through the N-th output digital signals coincide with the output terminal code represented by the output terminal code signals, respectively. The first through the N-th judging circuits 28-1 to 28-N thereby produce judgment result signals representative of results of the judgment and deliver the judgment result signals to the control unit 18.

Connected to the first through the N-th output lines 12-1 to 12-N, respectively, the first through the N-th judging circuits 28-1 to 28-N deliver the first through the N-th output digital signals to the first through the N-th output lines 12-1 to 12-N with the correspondence terminal code signals deleted from the first through the N-th output digital signals, respectively.

What is claimed is:

1. A cross-connection confirming system for use in a cross-connection network comprising first through N-th input lines, a matrix switch, and a controller, where N represents an integer greater than one, said matrix switch comprising first through N-th input terminals having input terminal codes, respectively, and first through N-th output terminals having output terminal codes, respectively, said controller comprising: a memory for memorizing connection information signals indicating, in correspondence to the input terminal codes of said first through said N-th input terminals, the output terminal codes of connecting destination ones of said first through said N-th output terminals that should be connected to said first through said N-th input terminals, respectively; and a control unit connected to said memory and said matrix switch for controlling said matrix switch to make said matrix switch cross connect between said first through said N-th input terminals and the connecting destination ones of said first through said N-th output terminals in accordance with said connection information signals; said cross-connection confirming system being for confirming whether or not said matrix switch correctly carries out cross-connection between said first through said N-th input and said first through said N-th output terminals in accordance with said connection information signals, said cross-connection confirming system comprises:

first through N-th input terminal code generating means for generating input terminal code signals representative of the input terminal codes of said first through said N-th input terminals, respectively;

first through N-th processing means connected to said first through said N-th input terminal code generating means, to said first through said N-th input terminals, and to said first through said N-th input lines, respectively, and supplied with first through N-th input digital signals through said first through said N-th input lines, respectively, each of said first through said N-th input digital signals including transmission data bit fields and blank bit fields having blank bits representative of zero values and periodically appearing in said each of said first through said N-th input digital signals, said first through said N-th processing means being for processing said first through said N-th input digital signals into first through N-th processed signals given by inserting the input terminal code signals representative of the input terminal codes of said first through said N-th input terminals into the blank bit fields of said first through said N-th input digital signals, respectively, said first through said N-th processing means being for delivering said first through said N-th processed signals to said first through said N-th input terminals, respectively, and first through N-th judging means connected to said memory in common, to said first through said N-th output terminals, respectively, and to said control unit in common, said first through said N-th judging means being for receiving first through N-th output digital signals from said first through said N-th output terminals, respectively, and for receiving corresponding ones of the input terminal codes of said first through said N-th input terminals from said memory, respectively, said corresponding ones of the input terminal codes of said first through said N-th input terminals corresponding to the output terminal codes of said first through said N-th output terminals to which said first through said N-th judging means are connected, said first through said N-th judging means being for carrying out judgment as regards whether or not the input terminal codes represented by the input terminal code signals included in said first through said N-th output digital signals coincide with said corresponding ones of the input terminal codes of said first through said N-th input terminals, respectively, said first through said N-th judging means thereby producing judgment result signals representative of results of said judgment, respectively, and delivering said judgment result signals to said control unit;

said control unit being for receiving said judgment result signals and for confirming, when all of the results of said judgment are affirmative and when at least one of the results of said judgment is negative, that said matrix switch correctly carries out said cross-connection and that said matrix switch does not correctly carry out said cross-connection, respectively.

2. A cross-connection confirming system as claimed in claim 1, said cross-connection network further comprising first through N-th output lines, wherein:

said first through said N-th judging means being furthermore connected to said first through said N-th output lines, respectively, said first through said N-th judging means being for delivering said first through said N-th output digital signals to said first through said N-th output lines with the input terminal code signals deleted from said first through said N-th output digital signals, respectively.

3. A cross-connection confirming system for use in a cross-connection network comprising first through N-th input lines, a matrix switch, and a controller, where N represents an integer greater than one, said matrix switch comprising first through N-th input terminals having input terminal codes, respectively, and first through N-th output terminals having output terminal codes, respectively, said controller comprising: a memory for memorizing connection information signals indicating, in correspondence to the input terminal codes of said first through said N-th input terminals, the output terminal codes of connecting destination ones of said first through said N-th output terminals that should be connected to said first through said N-th input terminals, respectively; and a control unit connected to said memory and said matrix switch for controlling said matrix switch to make said matrix switch cross connect between said first through said N-th input terminals and the connecting destination ones of said first through said N-th output terminals in accordance with said connection information signals; said cross-connection confirming system being for confirming whether or not said matrix switch correctly carries out cross-connection between said first through said N-th input and said first through said N-th output terminals in accordance with said connection information signals, said cross-connection confirming system comprises:

first through N-th processing means connected to said memory in common, to said first through said N-th input terminals, and to said first through said N-th input lines, respectively, and supplied with first through N-th input digital signals through said first through said N-th input lines, respectively, each of said first through said N-th input digital signals including transmission data bit fields and blank bit fields having blank bits representative of zero values and periodically appearing in said each of said first through said N-th input digital signals, said first through said N-th processing means being for receiving correspondence terminal code signals representative of corresponding ones of the output terminal codes of said first through said N-th output terminals from said memory, respectively, said corresponding ones of the output terminal codes of said first through said N-th output terminals corresponding to the input terminal codes of said first through said N-th input terminals to which said first through said N-th processing means are connected, said first through said N-th processing means being for processing said first through said N-th input digital signals into first through N-th processed signals given by inserting the correspondence terminal code signals representative of said corresponding ones of the output terminal codes of said first through said N-th output terminals into the blank bit fields of said first through said N-th input digital signals, respectively, said first through said N-th processing means being for delivering said first through said N-th processed signals to said first through said N-th input terminals, respectively;

first through N-th output terminal code generating means for generating output terminal code signals representative of the output terminal codes of said first through said N-th output terminals, respectively, and first through N-th judging means connected to said first through said N-th output terminal code generating means, to said first through said N-th output terminals, respectively, and to said control unit in common, said first through said N-th judging means being for receiving first through N-th output digital signals from said first through said N-th output terminals, respectively, said first through said N-th judging means being for carrying out judgment as regards whether or not said corresponding ones of the output terminal codes represented by the correspondence terminal code signals included in said first through said N-th output digital signals coincide with the output terminal codes represented by said output terminal code signals, respectively, said first through said N-th judging means thereby producing judgment result signals representative of results of said judgment, respectively, and delivering said judgment result signals to said control unit;

said control unit being for receiving said judgment result signals and for confirming, when all of the results of said judgment are affirmative and when at least one of the results of said judgment is negative, that said matrix switch correctly carries out said cross-connection and that said matrix switch does not correctly carry out said cross-connection, respectively.

4. A cross-connection confirming system as claimed in claim 3, said cross-connection network further comprising first through N-th output lines, wherein:

said first through said N-th judging means being furthermore connected to said first through said N-th output lines, respectively, said first through said N-th judging means being for delivering said first through said N-th output digital signals to said first through said N-th output lines with the correspondence terminal code signals deleted from said first through said N-th output digital signals, respectively.

* * * * *